United States Patent [19]

Isaacson et al.

[11] Patent Number: 4,662,747

[45] Date of Patent: May 5, 1987

[54] METHOD AND APPARATUS FOR PRODUCTION AND USE OF NANOMETER SCALE LIGHT BEAMS

[75] Inventors: Michael Isaacson; Aaron Lewis, both of Ithaca, N.Y.

[73] Assignee: Cornell Research Foundation, Inc., Ithaca, N.Y.

[21] Appl. No.: 520,041

[22] Filed: Aug. 3, 1983

[51] Int. Cl.[4] .......................................... G01N 21/63
[52] U.S. Cl. ................................. 356/317; 350/319; 350/507
[58] Field of Search ............. 250/458.1, 461.1, 461.2, 250/462.1; 350/319, 322, 448, 507; 356/301, 310, 317, 318, 326, 417

[56] References Cited

U.S. PATENT DOCUMENTS

| | | | |
|---|---|---|---|
| 3,607,680 | 9/1971 | Uno et al. | 204/24 |
| 3,668,028 | 6/1972 | Short | 156/643 |
| 3,782,823 | 1/1974 | Kantorski et al. | 356/318 |
| 3,852,134 | 12/1974 | Bean | 156/643 |
| 4,030,827 | 6/1977 | Delhaye et al. | 356/318 |
| 4,100,416 | 7/1978 | Hirschfeld | 356/318 |
| 4,155,801 | 5/1979 | Provancher | 156/630 |
| 4,182,010 | 1/1980 | Lemmond | 29/25.180 |
| 4,195,930 | 4/1980 | Delhaye et al. | 356/318 |
| 4,262,186 | 4/1981 | Provancher | 219/121.038 |
| 4,269,653 | 5/1981 | Wada et al. | 156/644 |
| 4,331,505 | 5/1982 | Hirt | 156/643 |

FOREIGN PATENT DOCUMENTS 2039031 7/1980 United Kingdom ................ 356/417

OTHER PUBLICATIONS

"Two-Dimensional Encoding Masks for Hadamard Spectiometric Imager", Moharir, *IEEE Transactions on Electromagnetic Compatability*, vol. EMC-16, No. 2, May 1974, p. 126.

P. A. Ash and G. Nichols, "Super-resolution Aperture Scanning Microscope," pp. 510-512, *Nature*, vol. 237, Jun. 30, 1972.

Abstract "Scanning Optical Spectral Microscopy With 500Å Spatial Resolution", *Biophysical Journal*, vol. 41, No. 2, Part 2, Feb. 1983, Lewis et al.

*Primary Examiner*—F. L. Evans
*Attorney, Agent, or Firm*—Jones, Tullar & Cooper

[57] ABSTRACT

An optical system for determining and reproducing spatial separation of features in the range of 80Å to 2500Å for optical microscopy and lithography using visible light, the system being independent of the wavelength of the incident light. An aperture mask is provided having at least one aperture of between about 80Å and 2500Å diameter. The mask may be used in optical microscopy to view objects with a high degree of resolution by placing the mask within the near field of light emanating from a sample to be viewed. The mask may also be used for high resolution optical lithography by placing a resist material within the near field of light passing through the mask.

44 Claims, 11 Drawing Figures

METHOD AND APPARATUS FOR PRODUCTION AND USE OF NANOMETER SCALE LIGHT BEAMS

BACKGROUND OF THE INVENTION

The present invention relates, in general, to high resolution optical systems, and more particularly to a method and apparatus for the production and use of light beams having diameters in the range of 100 to 500 Å. The invention further relates to optical microscopes having a resolution on the order of 500 Å, to methods of studying objects using such a microscope, and to methods of lithography utilizing the high resolution capabilities of the apparatus of the present invention.

With the advance of submicron technology, the need for a light microscope for use in microanalysis of materials has steadily increased. Although electron microscopes are capable of detecting objects with a very high degree of resolution, viewing by this means not only requires that the sample be inserted into a vacuum, but often results in destructive effects on the sample because of the ionizing radiation.

With presently available technology, nondestructive viewing can be obtained using visible light in two different ranges. At the lower end of the scale, fluorescence spectroscopy coupled with chemical methods can be used to determine on a statistical basis the dimensions between objects that are up to about 80 Å apart. At the upper end of the scale, light microscopy, when used in the fluorescence mode, can be used to determine dimensions as small as about one-half the wavelength of the light that is used; that is, down to about 2500 Å. However, separations between objects (or feature dimensions) of between 80 Å and 2500 Å are inaccessible using visible wave lengths. The ability to determine such dimensions using light microscopy is very important since, unlike electron microscopy, samples can be studied in their natural environment without resorting to high vacuum conditions and without the risk of damage. Such a capability is particularly useful in biological applications where clinical testing or chemical mapping are to be done.

Advances in microelectronics are leading to smaller and smaller structures. However, the techniques for fabricating such devices have not kept pace with such developments, and the volume production of microscale devices presents a difficult problem. Optical lithography is, at the present time, limited to the production of features having a size of approximately 1 micron (10000 Å), although improvements using far ultraviolet radiation allows sizes down to one-half micron (5000 Å) to be achieved. To fabricate structures with even smaller sizes, one must resort to electron, ion, or X-ray beam technology.

Although electron and ion beam technology are now the most widely used methods in the microelectronics industry for producing submicron structures, such methods have a relatively low rate of production due to the need to scan the beam across the wafer on which the structure is being formed. X-ray methods are being investigated since a larger production rate may be achievable, although such methods require a dedicated synchrotron source. An extension of optical technology to the half micron size scale would couple the small feature size capability of electron, ion, and X-ray beam technology to the higher rates which are necessary for economical production.

SUMMARY OF THE INVENTION

It is an object of the present invention to provide a method and apparatus for producing and using light beams having a diameter on the order of 500 Å.

It is another object of the present invention to overcome the disadvantages of prior optical devices through the provision of a light microscope capable of measuring objects having separations of between about 80 Å and 2500 Å.

It is a further object of the present invention to provide a visible light microscope having a resolution of better than 500 Å, using visible light.

It is another object of the present invention to provide an apparatus for measuring feature dimensions with a resolution of less than about 500 Å, using visible light.

It is still another object of the present invention to provide a method of fabricating a light aperture mask having feature dimensions on the order of less than or about 500 Å.

A still further object of the present invention is to provide a method of patterning materials to produce feature dimensions on the order of 500 Å or less, using visible light.

The present invention is based on the discovery that visible radiation can be transmitted in useful amounts through apertures which are on the order of 1/16 of the wavelength of the incident radiation, and that when the aperture is within the near field of an object from which the radiation emanates, the radiation passing through the aperture will be the geometric projection of that aperture. This feature is essentially independent of the wavelength of the incident light, resulting in significant consequences in the field of optics and, more particularly, to both light microscopy and lithography.

Accordingly, it is another object of the present invention to provide a method of optical lithography wherein feature sizes of less than 1/10 the wavelength of visible radiation can be produced using the rapid replication rates of optical techniques while obtaining the high resolution normally available only with electron and ion beam methods.

It is an additional object of the invention to provide a scanning optical microscope with a spatial resolution of 1/10 the wavelength of the incident light to provide time-resolved chemical analysis and mapping without the need for the sample to be placed in a vacuum.

It is another object of the invention to provide a scanning optical microscope which may be used for spatial and chemical characterization of an object at the level of resolution of a scanning electron microscope, but without the need for vacuum handling and without the destructive effects of electron beams.

In order to accomplish optical lithography and microscopy for feature dimensions on the order of less than 1/10 the wavelength of the incident light, the observation of light transmission through apertures having similar diameters has to be coupled with a knowledge of the near field radiation patterns produced by light passing through a small aperture. When an aperture is very close to or in contact with a lithographic substrate (to which the pattern of the aperture is to be applied), or is very close to or in contact with an object to be imaged, the radiation field through the aperture is the geometric projection of the aperture shape. If the object (or substrate) is moved away from the apertures, the radiation pattern produced by light passing through the aperture becomes more diffuse as a result of the changing angular distribution of the radiation. This diffusion occurs in what is known as the Fresnel region. Eventually, as the object is moved further away, a distance is reached where the angular distribution of the radiation pattern becomes constant as a function of distance, so that further motion does not change the shape or size of the pattern. This is known as the far field of the light pattern.

Between the point of contact of the aperture with the object, and the beginning of the Fresnel region, the angle of the radiation pattern is relatively constant, and light passing through the aperture essentially projects its shape. This region is known as the "near field", and extends for a distance of about 1000 Å from the surface of the aperture mask. Although this near field phenomenon had previously been demonstrated using microwave radiation passing through an aperture, it has not previously been possible to confirm the existence of such a phenomenon using optical wavelengths because of the inability to fabricate structures having apertures with diameters on the order of 1/10 to 1/16 the wavelength of the incident light.

As will be described hereinbelow, applicants have now constructed an aperture plate incorporating apertures having diameters on the order of 300 Å, and have demonstrated that visible light can pass through such apertures, independently of the wavelength of the light. An important aspect of this light transmission is the relatively high transmission obtained, which was sufficient to obtain detectable amounts of light using an ordinary microscope illuminator lamp as the source.

The foregoing principles lead to two important applications. First, if a stencil pattern with 300 Å to 500 Å feature sizes is used in place of an aperture mask, and a substrate covered with a very thin layer of photoresist is placed in the near field region of light passing through the pattern, the entire stencil pattern can be imprinted onto the resist with a very high degree of accuracy, since in the near field region, the light pattern retains the geometric shape of the aperture. This allows optical lithography with feature sizes as small as 300 Å independent of the wavelength of the incident radiation. Secondly, the same fundamental principles apply to the imaging of an object through the use of scanning techniques. Specifically, spectral phenomena produced by illuminating an object also exhibits the near-field radiation pattern, in that the spectral phenomena will be essentially perpendicular to the surface from which it emanates within the near field region of the surface. The spectral phenomena thus is essentially collimated in the near field, permitting observation of a field of view which is limited to the projected area of the aperture on the surface being observed, as long as the aperture is in the near field. The spectral phenomena passing through the aperture can then be recorded in the far field where an image of the object can be formed if the aperture or an aperture array is scanned in a raster-like fashion relative to the object. Such a scanning optical system will have a spatial resolution limited by the aperture diameter instead of by the wavelength of the incident light or of the spectral phenomena emanating from the surface, and thus will have a resolution on the order of 1/10 the wavelength.

In one aspect of the present invention, then, a visible light microscope is provided which incorporates an aperture plate having at least one aperture with a diameter of less than about 500 Å. The aperture plate is an optically opaque metal or dielectric film secured in a holder, and is movable with respect to the object to be studied. A suitable transducer, capable of moving the aperture plate in steps of about 100 Å, is used. Alternatively, the object, or sample, which is to be observed by the microscope may be moved relative to the aperture. Piezoelectric manipulators capable of moving an object in steps on the order of 100 Å are readily obtained commercially.

The microscope further includes at least one source of light which is to be projected at the surface to be viewed. A collimated, intense source of light is needed, and lasers provide a suitable source; however, other sources of light also may be suitable. The incident light beam stimulates the sample material, causing it to emit light by fluorescence, surface-enhanced Raman scattering, resonance Rayleigh scattering, or other phenomena. The aperture plate is close to or in contact with the surface of the sample being measured, so that the emitted spectroscopic phenomena pass into the aperture or apertures in the plate in the near field.

If the aperture plate is positioned within the near field of the surface of the sample, spectral phenomena emanating from the surface area corresponding to the aperture will pass through the aperture. The aperture plate must be sufficiently thin as to be fully transparent to the spectral phenomena where there is an aperture, so that the aperture wall does not interfere with the light, but it must be thick enough to be opaque where there is no aperture. A thickness of about 500 Å is used. The signal emerging from the side of the aperture not in contact with the sample may be detected in the far field by means of a spectrograph and is analyzed by means of an optical multi-channel analyzer. The aperture is scanned over the sample in steps, so that a spectral map of the sample is processed and may be displayed on a two dimensional digital display.

An important aspect of the present invention is that by maintaining contact or near contact between the aperture plate and the surface of the sample, and by providing a plate thickness of about 500 Å, the spectral phenomena emitted from the aperture remain in a near field condition. This maintains the spatial information which would be lost if the emitted light or other spectral signal was in a far field condition relative to the aperture. Although the light signal collected by an objective lens on the side of the aperture plate farthest away from the sample is in the far field, that does not affect the ability of the device to maintain the spatial information once the signal has passed through the aperture.

In one embodiment of the invention, the light which is projected at the surface to be viewed comprises a beam, for example from a laser, which strikes the surface of the sample at a grazing angle of incidence; i.e., substantially tangentially with respect to that surface. The angle of incidence is such as to create an evanescent field approximately 800 Å deep in the material, the exact depth depending on the angle of incidence and the material being studied. The evanescent field results in the production of spectroscopic phenomena which may be observed through the aperture, as described above. The angle of incidence of the laser may be varied to produce different levels of evanescence in the sample. When the sample is excited to different depths, the differences in spectra obtained thereby may be compared to provide three-dimensional surface information concerning the sample such as, for example, the chemical distribution within the sample.

Where the sample material is transparent to the incident light, the light source may be directed toward the bottom surface of the sample holder, with the light passing into the sample and producing the desired evanescent effect. Such an arrangement may be particularly suitable for spectroscope studies of living materials such as bacteria, viruses and the like. In still another embodiment, the light may be directed downwardly onto the surface of the sample, passing through the viewing aperture before striking the sample material, exciting that material to produce spectral phenomena which then pass through the aperture for observation.

For extremely low light levels produced, for example, from small concentrations of a sample, a single aperture in the aperture plate is inefficient, since the input light source illuminates at least 100 times the area being viewed by a single aperture at any given time. With a single aperture, only a small percentage of the available information can be collected, and this reduces the signal-to-noise ratio of the measurements. This problem can be overcome by the use of Hadamard Transform Imaging methods which allow retrieval of a two-dimensional spatial image by measuring the intensities that pass through a binary coded mask at different positions of the mask. With such methods, a suitable mask would include multiple apertures each of 5 less than or about 500 Å in diameter arranged in a binary coded array, the multiple aperture mask being used in place of the single aperture mask and being illuminated by spectral signals emitted from the sample. The encoded regions are either opaque or transparent to visible light, and when the mask is moved in very small steps, measurements are taken of the intensity pattern produced by the mask in each position. These light patterns can then be decoded to recover the spatial distribution of the light over the sample, thereby permitting a two-dimensional measurement of the sample.

The optical system of the present invention thus provides an optical microscope having a spatial resolution which approaches that of a scanning electron microscope, but which is completely non-destructive, allows a sample to be viewed in situ without the need for placing it in a vacuum, and provides chemically selective viewing of the sample. Furthermore, since the aperture allows the passage of light with a substantial intensity, measurements do not require a long time period, and thus the formation of time-resolved images is possible. No other existing microscopic probe has all of these features. Furthermore, the optical system of the invention permits optical lithography having feature sizes as small as 300 Å independent of the wavelength of the incident radiation, thereby permitting high replication rates with high resolution, and providing a significant advance in micro-fabrication technology.

BRIEF DESCRIPTION OF THE DRAWINGS

The foregoing and additional objects, features and advantages of the present invention will become apparent from a consideration of the following detailed description of preferred embodiments thereof, taken in conjunction with the accompanying drawings, in which.

DESCRIPTION OF PREFERRED EMBODIMENTS

The present invention rests, in large measure, on the fundamental principle that light will in significant quantities pass through an aperture having a diameter which is substantially smaller than the wavelength of the light to be transmitted. That light will pass through such an aperture in significant and detectable quantities is demonstrated in the micrograph of FIG. 1, which illustrates an aperture plate 10 carrying a first set of apertures 12, 14, 16 and 18, and a second, duplicate, set of apertures 12', 14', 16' and 18'. Each of the pairs of apertures 12, 12', etc. are separated by six micrometers. The first set of apertures 12, 14, 16 and 18 are 2400 Å, 1200 Å, 640 Å and 320 Å in diameter, respectively, to within ten percent accuracy, and the second set is the same. Electron micrographs 20, 22, 24 and 26 were obtained by an electron scanning microscope to obtain exact measurements of the apertures 12, 14, 16 and 18, respectively, confirming not only their rectangular shape, but their size.

Figure 1:
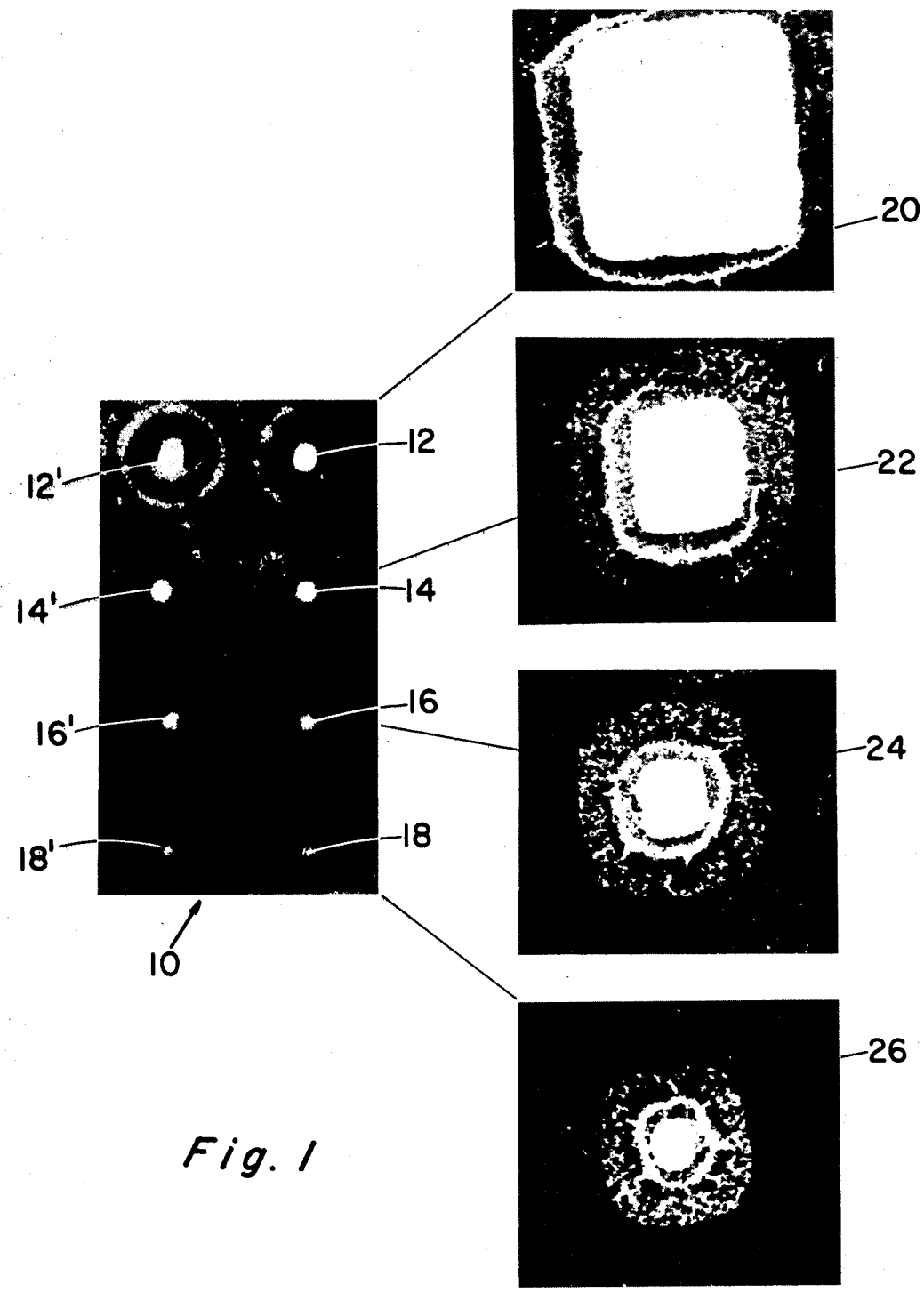
FIG. 1 is a light micrograph recorded in the far field and showing light transfer through apertures, and electron micrographs of the same apertures.

In making the micrograph illustrated in FIG. 1, the aperture plate 10 was illuminated with visible light, and light passing through the apertures was recorded in the far field by conventional optical means. The micrograph clearly illustrates that significant amounts of visible light pass through an aperture of 320 Å (32 nm). It is noted that the light source was an ordinary tungsten microscope illuminator, but similar results are obtained with other light sources, demonstrating that the passage of light through such apertures is not dependent on the wavelength of the light.

Figure 2:
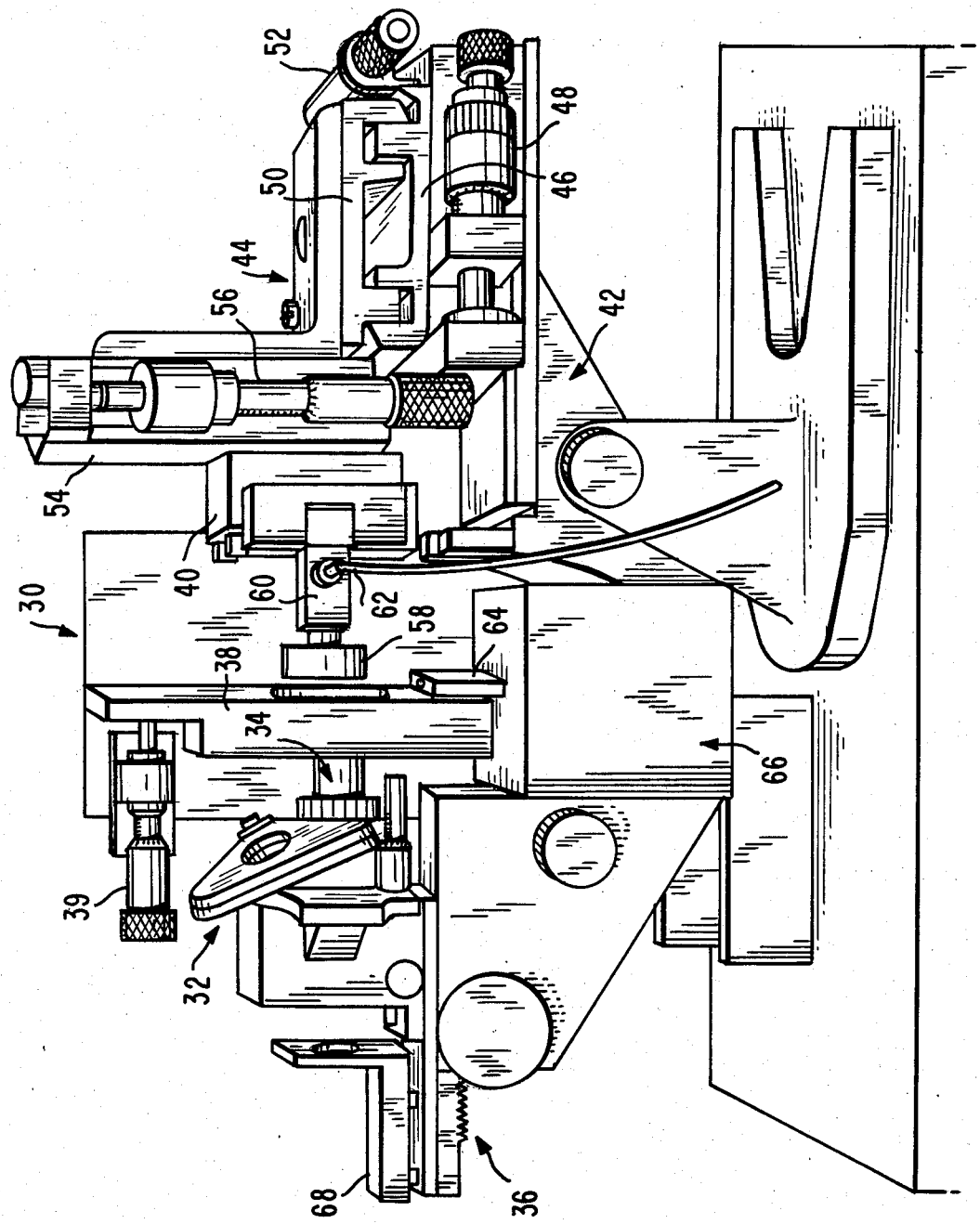
FIG. 2 is a partial diagrammatic illustration of a light microscope incorporating the present invention.

A scanning microscope utilizing the principles of the present invention is illustrated diagrammatically at 30 in FIG. 2, to which reference is now made. The basic components of the microscope are conventional, and include adjustable optics indicated generally at 32 and incorporating an objective lens housing 34, focusing means 36 for adjusting the position of the housing along its horizontal axis, a stage 38 surrounding the end of the objective lens housing and positionable by a micrometer 39, and an object support 40 mounted on the microscope frame 42 by means of a coarse positioning mechanism, generally indicated at 44.

The positioning mechanism 44 incorporates a first horizontally adjustable carrier 46 which is movable in a horizontal plane along the longitudinal axis of the lens contained in housing 34 and is mounted for accurate positioning by a suitable X-axis micrometer 48. A second horizontally adjustable carrier 50, is movable along an axis perpendicular to the longitudinal axis of the lens and is positionable by a second, Y-axis, micrometer 52. A vertically movable carrier 54 moves in a direction perpendicular to the longitudinal axis of the lens in housing 34, and is adjustable by means of a third, Z-axis, micrometer 56.

The adjustable object support 40 is mounted on the vertically movable carrier 54 which is, in turn, mounted on the two horizontally movable carriers 46 and 50 so that the object to be viewed by the microscope is movable orthogonally along X, Y and Z axes for positioning with respect to the objective lens in housing 34. The object to be viewed, or sample material, is mounted on a support table 58 which is carried on conventional piezoelectric scanners such as scanner 60 affixed to the support. The scanners are controllable by means of control signals supplied by way of cable 62 in known manner to cause the table 58 to be moved in a stepwise fashion in very small increments to permit fine positioning of the object and/or optical scanning thereof. Piezoelectric manipulators capable of moving the object in steps of approximately 100 Å are commercially available.

The illustrated scanner 60 responds to a control voltage to move the table 58 incrementally along the longitudinal, or X-axis, the extent of the motion depending upon the amplitude of the applied voltage. Because the piezoelectric scanner is capable of extremely small steps, the location of the sample material with respect to the lens housing 34 can be determined with great accuracy.

Although only a single incremental scanner 60 is illustrated in FIG. 2, it will be understood that in the preferred embodiment of the invention, three orthogonally-related piezoelectric scanners, or their equivalent, would be utilized to permit movement of the object support table 58 along the X, Y and Z axes. The manner of mounting and controlling such transducers is well known and does not constitute part of the present invention.

The conventional microscope illustrated in FIG. 2 and described hereinabove provides the support structure for the present invention. In order to carry out the inventive concepts, a source 64 of high intensity light is required and may be suitably mounted on the microscope base. The source 64 is shown as being mounted on the support frame member 66, but it may be mounted on a separate platform (not shown), if desired. In similar manner, suitable viewing optics or measuring instruments, such as a spectrograph (see FIG. 3) also are mounted on the microscope frame, for example on a mounting bracket 68 aligned with the optical axis of lens 14.

Although any intense source of visible light may be used, a particularly suitable source is a conventional laser.

Figure 3:
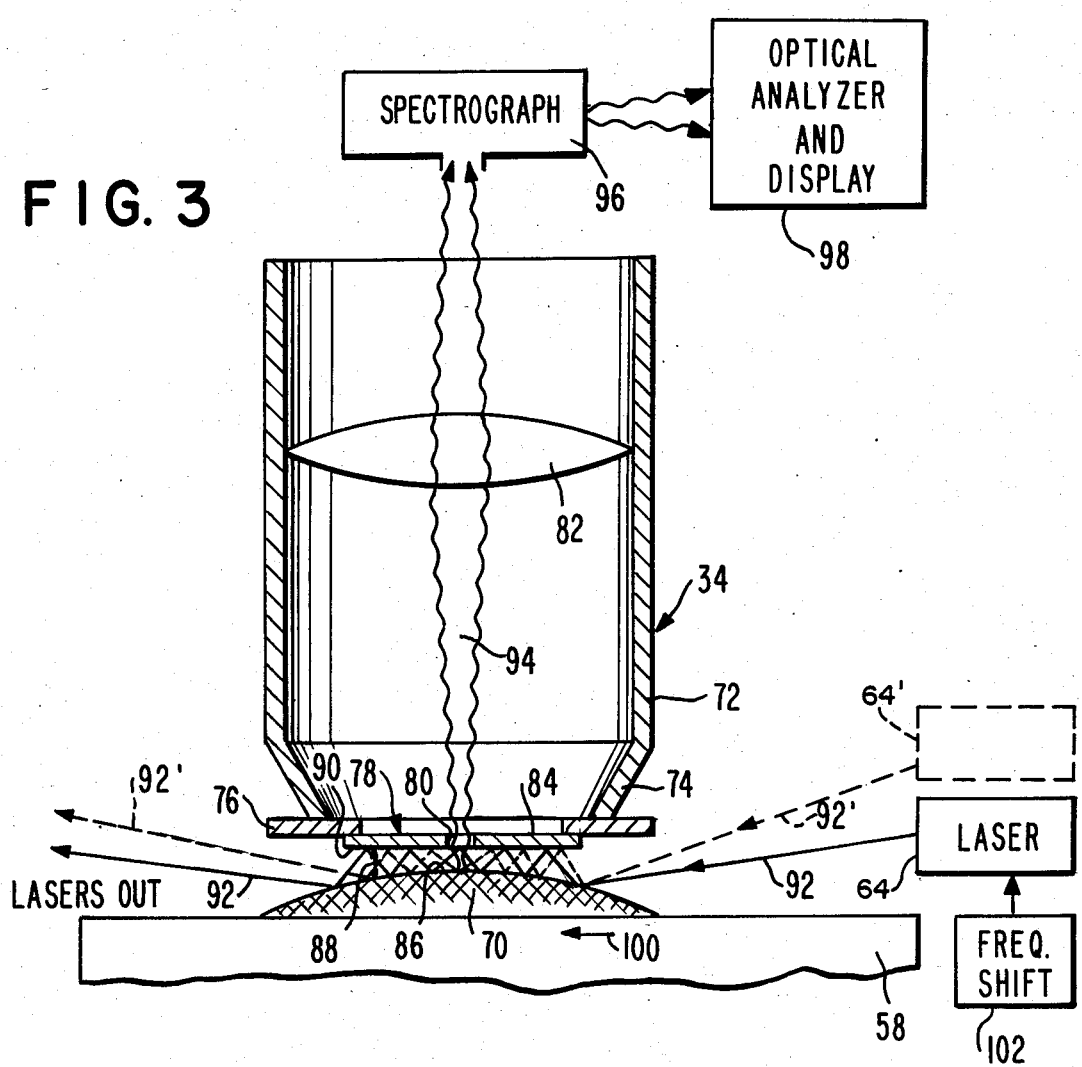
FIG. 3 is an enlarged sectional view of a portion of the microscope of FIG. 2, illustrating one embodiment of the invention.

As illustrated in FIG. 3, an object to be studied, or a sample material, 70 may be secured to the surface of the support table 58 which is, in turn, carried by the piezoelectric scanner 60. The sample material may be a polymer, a semiconductor array, a protein, a cell, a virus, bacteria, or any other material desired to be studied through the use of a light microscope with high resolution. The objective lens housing 34 includes a cylindrical wall 72 and a nosepiece 74 adapted to carry an aperture ring 76 which supports an aperture mask 78. The mask, which will be described in greater detail hereinbelow, is shown as having a single small aperture 80 which has a diameter of less than about 500 Å. The housing 34 also carries a suitable objective lens 82.

The structure of the microscope as illustrated in FIG. 2 is so arranged that by means of the various micrometer adjustments the housing 34 and the table 58 can be moved toward each other so as to bring the aperture mask 78 extremely close to the surface of the sample 70. The aperture mask is brought so close to the sample that it is within the near field of any light emanating from the surface of the sample. The near field has been found to extend about the distance of a single wavelength of the emitted light from the surface of the sample, but it is preferred that the top surface 84 of the aperture mask be within a distance approximating the diameter of the aperture, and thus within about 900 to 1000 Å from the top surface 86 of the sample. Thus, the surface 86 is spaced by a distance 88 from the bottom surface 90 of the aperture plate 78, the distance 88 being less than the near field distance for light emanating from sample 70.

The source of light 64, which may be a laser, is located to direct a beam 92 of light onto the surface of the sample material 70. As illustrated in FIG. 3, the beam 92 is directed at a grazing incidence with respect to the surface of the sample so that the beam 92 passes, with some reflection, through the space 88 between the upper surface 86 of the sample and the lower surface 90 of the aperture mask. The beam 92 passes out of the space, as illustrated, although a portion of its energy is absorbed by the surface layer of the sample material and causes spectroscopic phenomena to emanate in a direction perpendicular to the surface 86. The passage of the light beam energizes the surface layer and creates an evanescent field within the sample material. If the laser beam is incident at a grazing angle; that is, approximately tangent to the surface of the sample in the area of the aperture 80, the evanescent field will extend approximately 800 Å deep into the material.

The passing of the laser beam produces in the sample material a spectroscopic phenomenon which may be fluorescence, surface-enhanced Raman scattering, resonance Rayleigh scattering, or the like, depending on the nature of the sample material. The emissions so stimulated are collimated in the near field; that is, are emitted generally perpendicular to the surface 86 and remain substantially parallel to each other for the distance of the near field. Accordingly, most of the intensity of the light emanating from the sample is in the central lobe of the light pattern to maintain the spatial information concerning the specific source of the light. By placing the aperture mask within the near field distance, the light signal emitted from the surface of the sample material 70 will emerge from the exit side of the aperture (at surface 84) still in its collimated form, without interference by the walls of the aperture. This emerging light, which is diagrammatically illustrated by the wave lines 94, may then be detected by a suitable optical viewer located in the far field of the emitted light. Thus, the light waves 94 may be focused by means of lens 82 through a spectrograph 96, which produces a spectrum of the emitted light, to an optical multichannel analyzer 98 which may include a diode array. Such an array has a high spectral sensitivity, and produces an output for each picture element to provide a digital output corresponding to the intensity and wavelength of the light which passes through the aperture.

The sample material 70 may be scanned with respect to the aperture 80 in small incremental steps so that emitted light from different portions of the surface of the sample pass through the aperture to the spectrograph and the optical analyzer. The sample may, for example, be moved in the direction of the arrow 100 by means of a suitable piezoelectric manipulator in steps of approximately 100 Å. The optical analyzer then provides a display of the analysis for each step to produce a spectral map of the 800 Å deep region on a 2-dimensional digital display. Alternatively, the aperture 80 may be mounted on a suitable piezoelectric crystal manipulator for motion with respect to the surface of the sample 70 to obtain a similar analysis and display of the surface.

The process may be repeated with the beam 92 of the laser moved to a different angle with respect to the surface of the material 70, as illustrated by the dotted laser path 92', for example by means of suitable submicron manipulators (not shown). Alternatively, a second laser source 64' at a different frequency may be provided to permit two laser beams to be directed alternatively at grazing incidence onto the surface of the sample. In the latter case, the first laser beam 92 may be angled so as to illuminate the surface to a depth of 800 Å while the second beam 92' could be directed at an angle which provides a deeper penetration; for example, 1500 Å. The difference in output from the optical analyzer 96 for the two beams would be indicative, for example, of the chemical distribution in the sample material between 800 Å and 1500 Å.

Another alternative is to operate the laser 64 so that it switches between two frequencies to cause fluorescence of different materials in the sample. Thus, a frequency shifting switch 102 may be provided for the laser 64 to control its output frequency. If the two laser frequencies are within the absorbtion frequencies of two fluorescing entities of interest in the object the fluorescence produced by the two lasers will emerge through the aperture 80 with different wavelengths, and will be directed to the spectrograph 96 and to the optical analyzer 78 for detection. The measurement so obtained can be repeated as a function of the position of the aperture with respect to the surface of the sample material (as the sample is moved incrementally past the aperture 80), thereby providing an output which indicates the distribution of the fluorescing ions as a function of the position of the aperture with respect to the sample. This permits the chemical structure of the sample to be mapped out on the two-dimensional digital display 96.

It should be noted that the use of lasers at two different angles, or lasers of different frequencies at the same angle, or a laser at one frequency at the same angle, can be used to detect the maximum distance between two different entities within the surface of the sample, if these entities have different spectral characteristics. Thus, for example, if both spectra are seen through a single aperture 80, then their separations must be less than the aperture size. However, if only one is seen, then movement of the aperture or the surface, changing the light source angle or frequency, or a combination thereof, will reveal the distance between the entities to a high degree of accuracy.

When extremely low light level signals are produced from a single entity, or chemical constituent, within the sample material, a single aperture is an inefficient method of measuring the intensity of the emitted light. The input laser illuminates at least 100 times the area of the aperture, and a single aperture will collect only about two percent of the available information, with the result that, for a given measurement period, the signal to noise ratio is decreased by a factor of 10.

Figure 4:
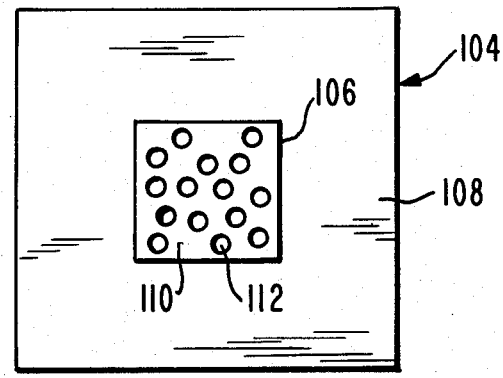
FIG. 4 is a diagrammatic top plan view of an aperture mask suitable for use in the present invention.

Such a low-signal situation can be improved using Hadamard Transform Imaging methods of the type described in "Modulation Techniques in Spectrometry", M. Harwitt and J. A. Decker, Jr., *Progress in Optics*, XII (E. Wolf, Editor), North Holland, Amsterdam, 1974, page 103. Such a method allows retrieval of a two-dimensional spatial image by measuring the light intensities that pass through a series of binary coded masks. In such an arrangement, an image having $N^2$ pixels (or picture elements) can be produced by means of a mask having $(2N-1)^2$ encoded positions, and by moving the mask to $N^2$ separate positions. Thus, for example, a $32 \times 32$ pixel array of 500 Å diameter pixels can be provided in a modified aperture mask 104 (FIG. 4) which incorporates a central mask portion 106 formed in a film 108. Such a film may be supported, for example, by a mounting ring 76 of the type illustrated in FIG. 3. The mask portion 106 fabricated to provide $63 \times 63$ encoded regions that are either opaque, such as region 110, or transparent to visible light, such as region 112, the exact arrangement of the transparent regions, or apertures, depending on the code used. The aperture mask 104 may be substituted for the mask 78 in the device of FIG. 3, or in any other configuration of this device.

Figure 5:
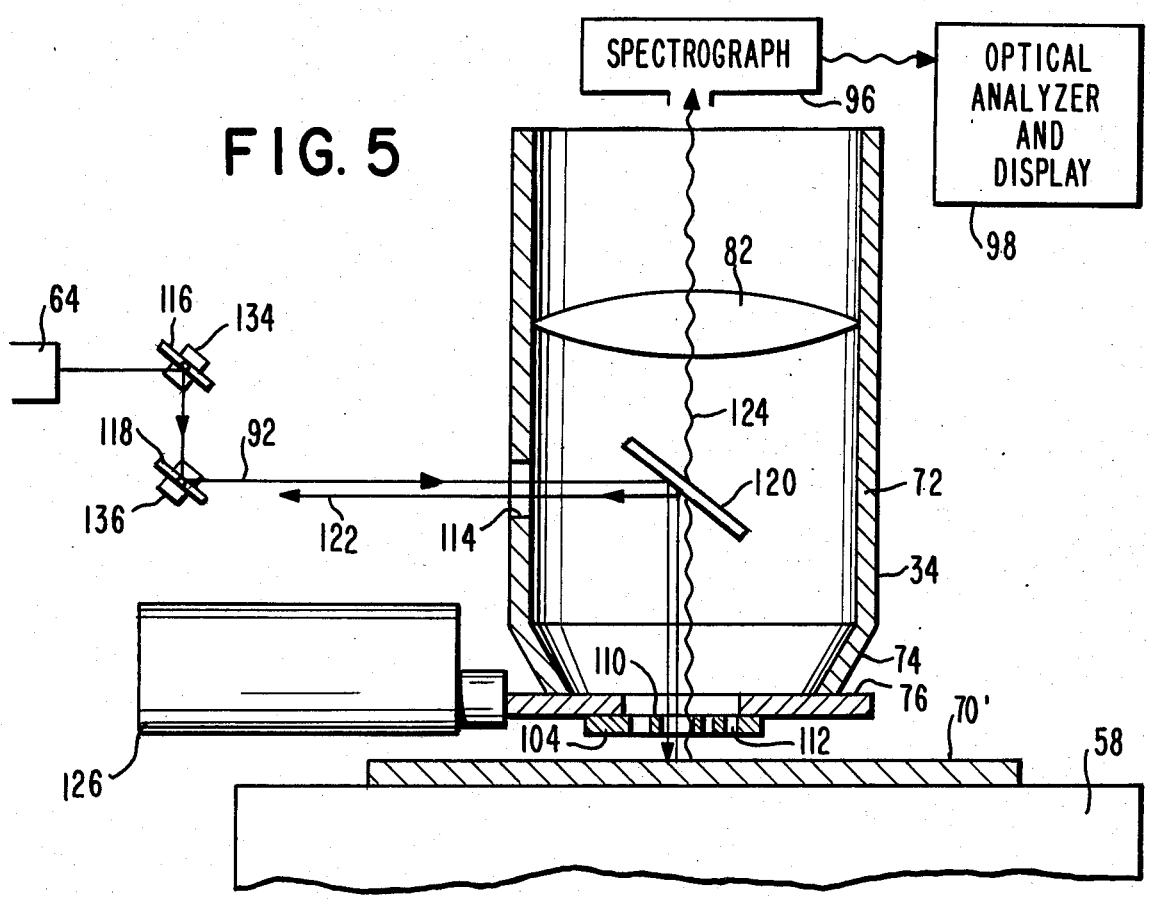
FIG. 5 is an enlarged sectional view of a portion of the microscope of FIG. 2, illustrating a second embodiment of the invention which utilizes the aperture mask of FIG. 3.

In another embodiment of the invention, a sample 70' may be illuminated by light directed perpendicularly onto the sample from the object housing 34 in the manner illustrated in FIG. 5, to which reference is now made. The aperture mask 104, which is used in this embodiment, is supported by ring 76 which is movably mounted on the nosepiece 74 of objective lens housing 34. The beam 92 from the source of light 64 in this case is not directed in grazing incidence across the surface of the sample material 70' (which is illustrated here as being different than the sample material 70 of FIG. 3), but instead the beam is directed through an aperture 114 in the wall 72 of the housing 34. The light beam 92 preferably is directed into the housing by way of angled reflectors 116 and 118, the beam then being directed by way of a beam splitter 120 within the housing 34 perpendicularly toward the surface of the sample material. A portion of the beam 92 is reflected upwardly from the upper surface of the opaque portions 110 of the aperture mask 104, while a portion passes through the apertures 112 and is reflected from the upper surface of material 70' and is returned by beam splitting mirror 120 to the exterior of housing 34 as indicated by return beam 122.

A substantial portion of the light energy directed onto the surface of material 70' is absorbed by that material and produces the spectroscopic phenomena described above and illustrated by the emitted wave 124 in FIG. 5. This phenomena, which may be produced by fluorescence within the material 70', for example, is of a different frequency than the beam 92, and thus passes through the beam splitter mirror 124, through the objective lens 82, and through the spectrograph 96 to the optical analyzer and display 98, in the manner previously described.

In the embodiment of FIG. 5, the mask 104 and its mounting ring 76 are preferably mounted for motion in a plane perpendicular to the axis of the housing 34 so that the aperture mask 104 can be moved in incremental steps in a direction parallel to the surface of the sample 70'. This scanning of the mask between the light source and the sample material permits spectral phenomena to pass through the mask in differing patterns corresponding to the code incorporated into the mask and the location of the mask. A measurement of the intensity of the light emitted at each step of the mask is obtained and decoded to recover the spatial distribution of the spectral phenomena at the surface. This motion of the aperture mask may be accomplished, for example, by means of a piezoelectric manipulator 126 secured to the frame of the microscope and adapted to move the support ring 76. Alternatively, the sample 70' can be moved with respect to the aperture mask by means of the piezoelectric adjusters 40 to which control the location of the support table 58.

Figure 6:
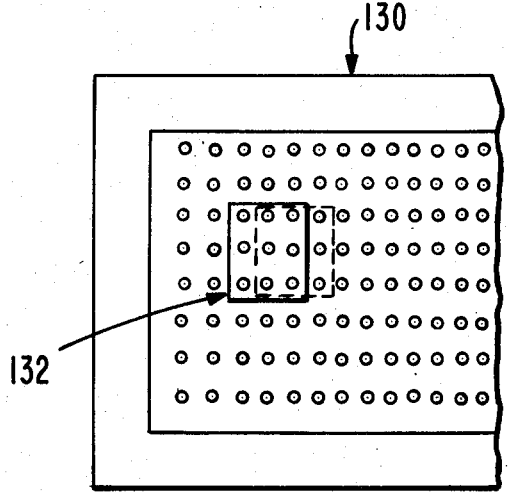
FIG. 6 is a partial top plan view of a modified form of the aperture mask of FIG. 4.

Another alternative scanning arrangement is illustrated in FIGS. 5 and 6 and incorporates means for translating the incident beam 92 across a stationary aperture mask of the type illustrated at 130 in FIG. 6. This mask is interposed between the light source and a stationary sample material 70' with the beam 92 scanning the sample through the mask rather than the sample or the mask being moved with respect to the beam. In this arrangement, the aperture mask 130 includes a cyclical plurality of contiguous mask sections 132 with each mask section including the same coded pattern of the type provided in aperture mask 104. The total pattern in mask 130 is now such that in translating the beam with respect to the mask the same pattern is illuminated. The scanning of beam 92 by mirrors 116 and 118 will have the same effect as moving either the mask or the sample material.

The scanning of the beam 92 may be accomplished, for example, by means of piezoelectric transducers 134 and 136 connected to rotatably drive the mirrors 116 and 118, respectively. Such an arrangement allows the beam 92 to be scanned across the entire mask 130. The resultant emitted wave at each position of the incident beam is then analyzed and displayed, in known manner.

Figure 7:
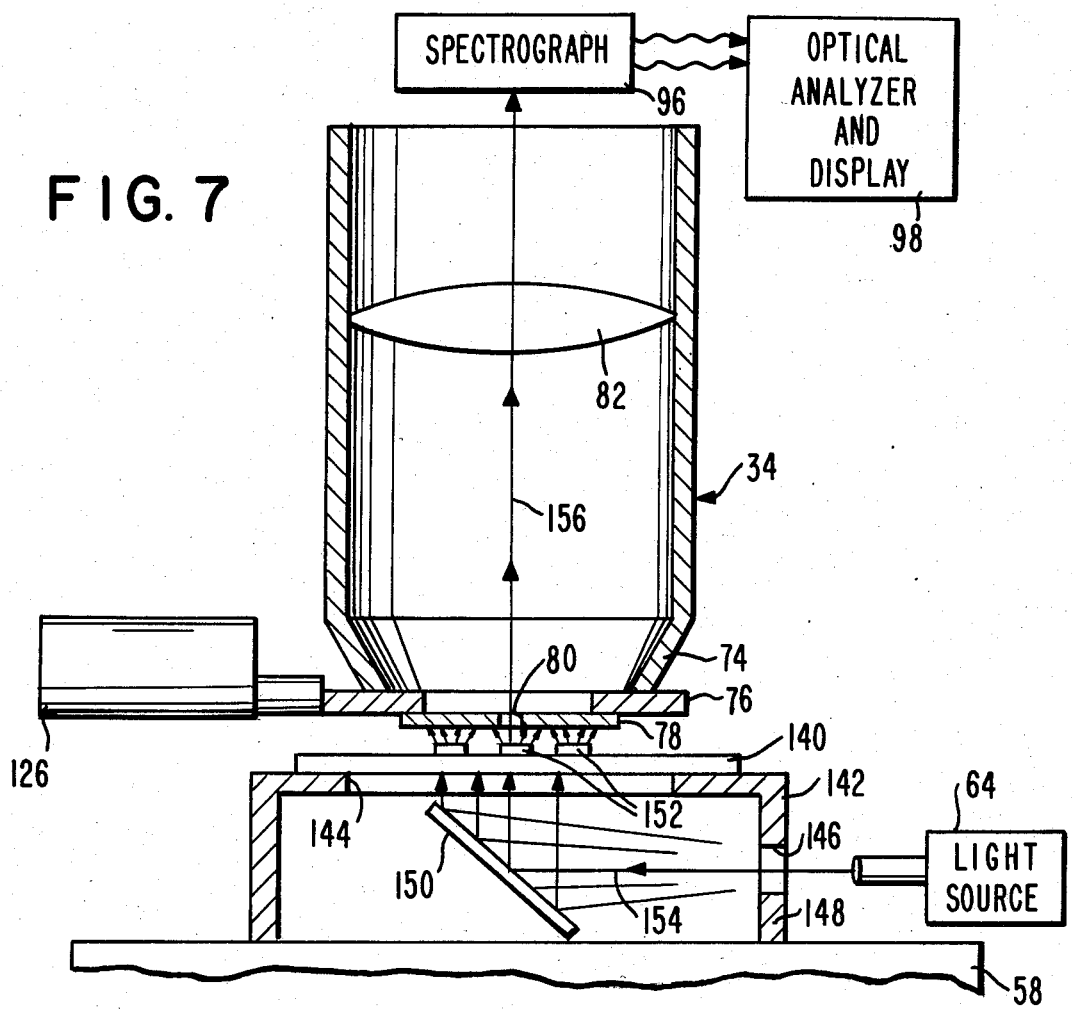
FIG. 7 is an enlarged sectional view of a portion of the microscope of FIG. 2, illustrating a third embodiment of the invention.

Still another embodiment of the present invention is illustrated in FIG. 7 wherein the optical system and aperture plate arrangement illustrated in FIG. 3 is used to detect spectral phenomena emitted by sample material which is generally transparent to the incident light. Thus, the lens housing 34 includes a nosepiece 74 adapted to carry the aperture ring 76 and to support the aperture mask 78, as previously described. A piezoelectric manipulator 126 is provided, as in the device of FIG. 5, to enable the aperture plate to be moved with respect to the sample material.

The sample material is carried on a slide 140 which is, in turn, mounted on a viewing support 142 secured to table 58. The viewing support may be generally U-shaped in cross-section and includes an aperture 144 on its upper surface, over which the slide 140 is mounted. A second aperture 146 may be incorporated in its side wall 148 by which light may be directed into the interior of the support. Suitable optics, such as a mirror 150, are included within the support 142 to direct incoming light, for example from light source 64, upwardly and through the slide 140. Sample material 152 carried on the upper surface of the slide, such as cellular material, bacteria, virus, or the like, are illuminated by the impinging light from source 64, as illustrated by the light beam 154. The incident light causes the sample material 152 to emanate spectral phenomena, as previously described, which phenomena passes through the aperture 80, as generally indicated by the wave 156, for detection by the spectrograph 96 and the optical analyzer and display 98.

Figure 8:
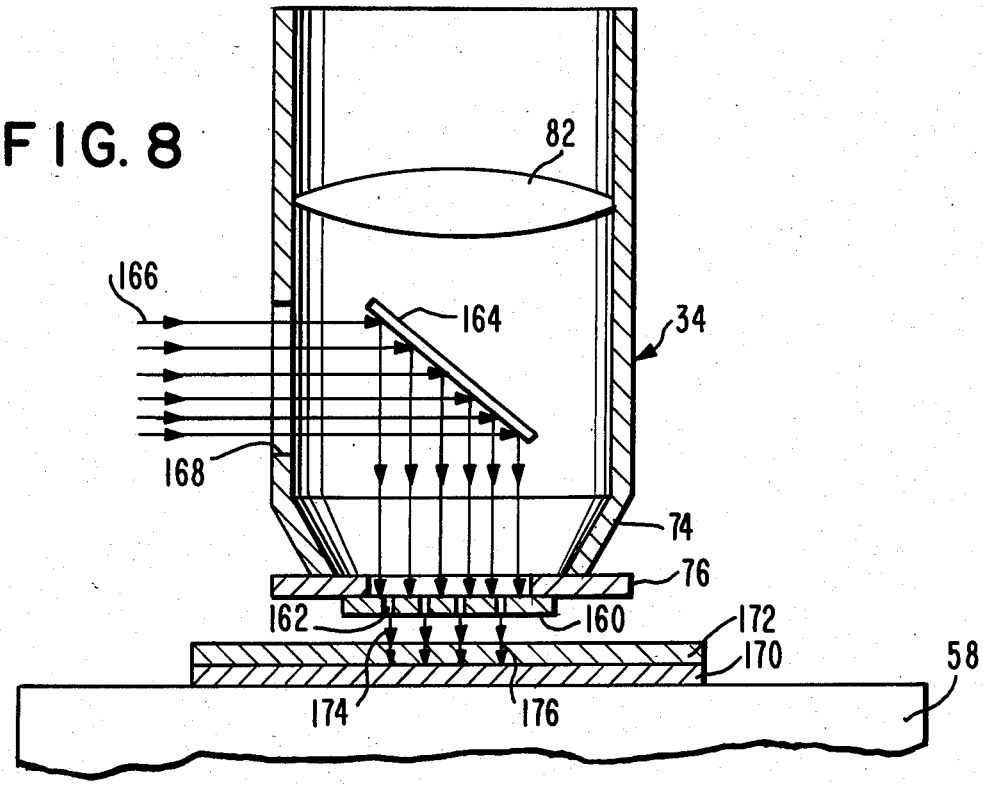
FIG. 8 is an enlarged sectional view of a portion of the device of FIG. 5, modified for use in lithography.

Although the description of preferred embodiments thus far has been directed primarily toward optical microscopy and the study of sample materials through spectroscopic analysis, the present invention is also concerned with the use of the principles described hereinabove in the field of optical lithography. Thus, FIG. 8 illustrates a modification of the foregoing devices to permit the reproduction of patterns in a lithographic process. Accordingly, the lens housing 34 includes a nosepiece 74 adapted to carry an aperture ring 76 which is adapted to support an aperture mask, here illustrated at 160. In this case, the mask 160 carries one or more apertures 162 in any desired pattern, which pattern is to be reproduced. It will be understood that the apertures may be elongated, and in one example may represent a stencil pattern suitable for use in the production of microelectronic circuits.

The lens housing 34 carries an angled mirror 164 which is adapted to direct incident light 166 perpendicularly onto the upper surface of aperture mask 160. The incident light is directed into the housing 34 by way of an aperture 168 in the side wall thereof. This light is visible light of any desired frequency, and, in accordance with the principles described above, will pass through the apertures 162 even where the aperture size is less than 1/10 the wavelength of that light.

Spaced immediately below the aperture mask 160, and within the near field region thereof, is a wafer 170 carrying on its upper surface a thin photoresist layer 172. Layer 172 preferably is on the order of about 1000 Å thick, which is about the extent of the near field region of light passing through apertures 162. This light, indicated at 174, exposes substantially the entire thickness of the photoresist material 172 to replicate in the photoresist material the stencil pattern carried by the aperture mask 160, as indicated by arrows 176. The photoresist material is then developed in conventional manner.

Since the incident light 166 will pass through an aperture as small as 300 Å, independently of the wavelength of the incident radiation, and since the geometry of the aperture is retained by the light passing therethrough within the near field region, this arrangement permits extremely accurate replication of the pattern contained in mask 160 and permits reproduction of patterns with feature sizes as small as 300 Å. Since the entire aperture mask can be illuminated at the same time (scanning is not required), rapid exposure of the entire stencil pattern into the resist can be accomplished, thus facilitating rapid reproduction of patterns having feature dimensions at least one-third the size of presently achievable with optical radiation lithography.

It will be noted that the lens 82 is retained in the housing 34 for use in aligning the aperture mask with the photoresist wafer.

Various techniques may be used to produce the thin film photoresist material 172 on the substrate 170, and conventional spinning techniques have been used for preparing films as thin as 1000 Å. In order to obtain the required lithographic resolution, however, it is necessary to fabricate photoresists at the molecular dimensions of the apertures.

Figure 10:
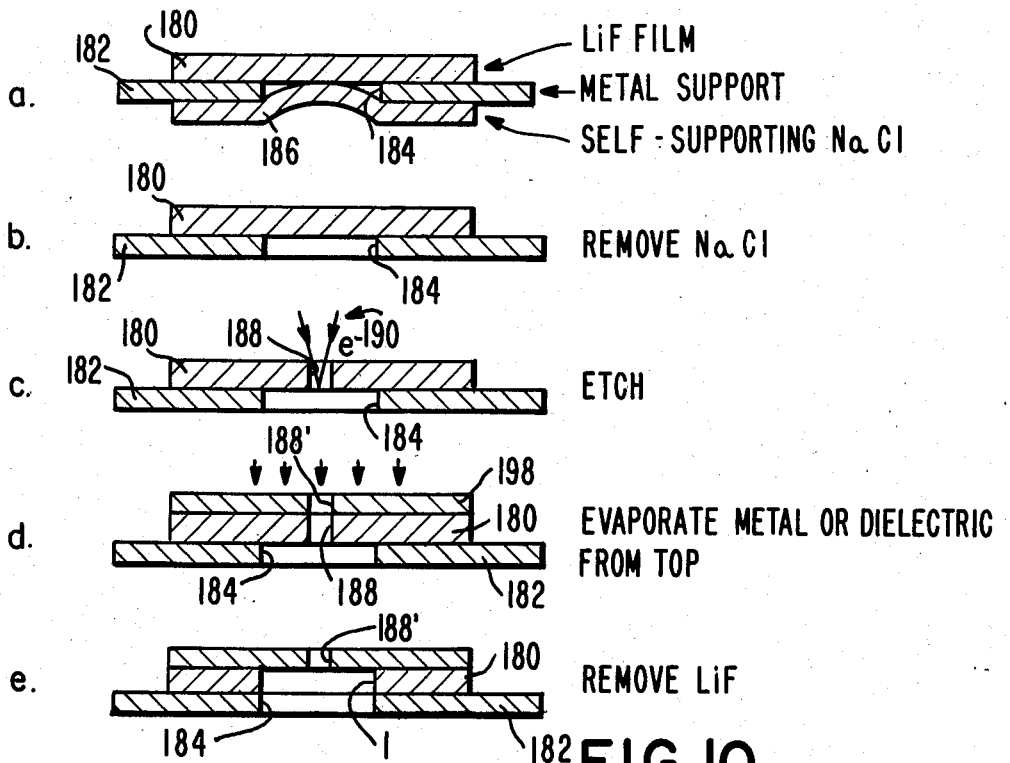
FIGS. 10a through 10e are diagrammatic illustrations of the steps in a second process for making an aperture mask in accordance with the present invention.
Figure 11:
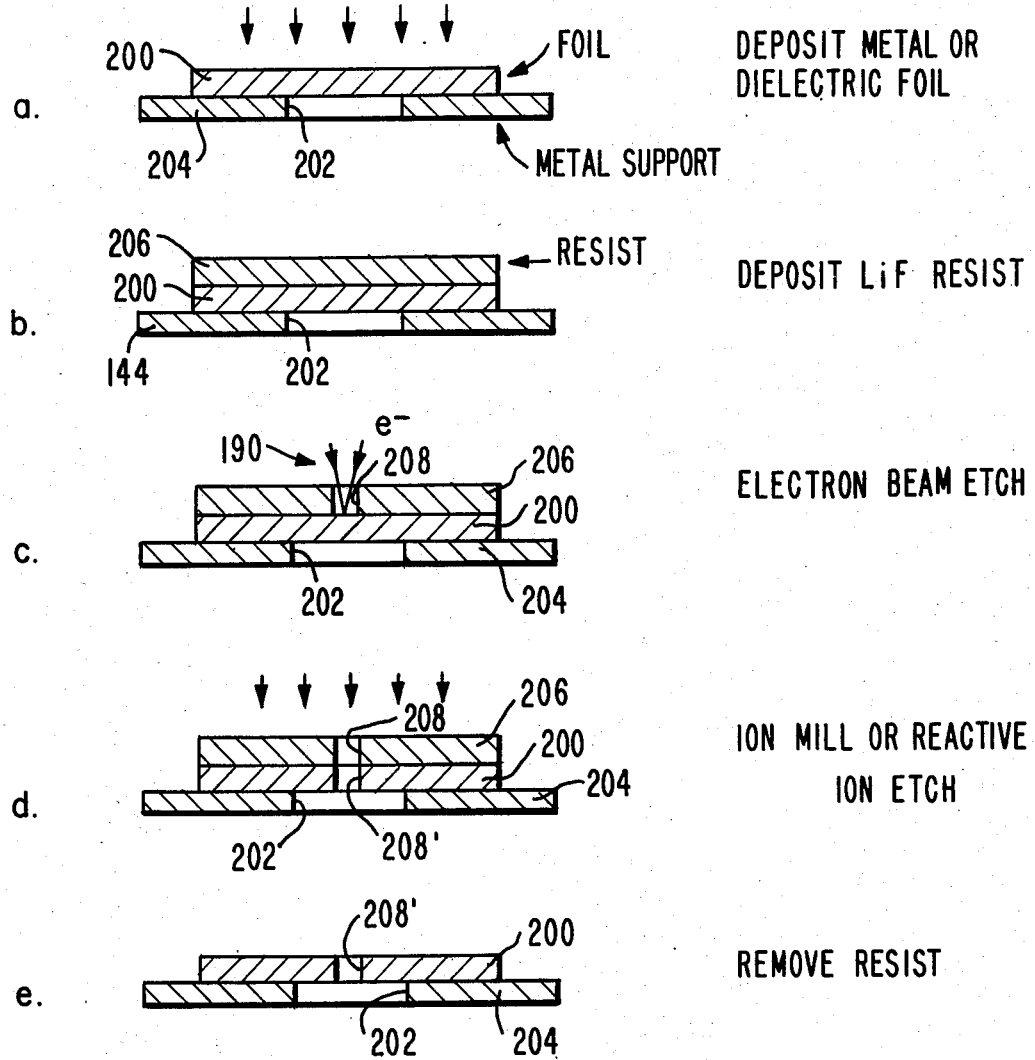
FIGS. 11a through 11e are diagrammatic illustrations of the steps in a third process for making an aperture mask.

An integral part of the present invention is the provision of, and fabrication of, an aperture mask incorporating apertures of less than 500 Å diameter both singly and in coded arrays. Methods for fabricating such aperture masks are illustrated in FIGS. 9, 10 and 11, with each method giving a slightly different aperture characteristic.

Figure 9:
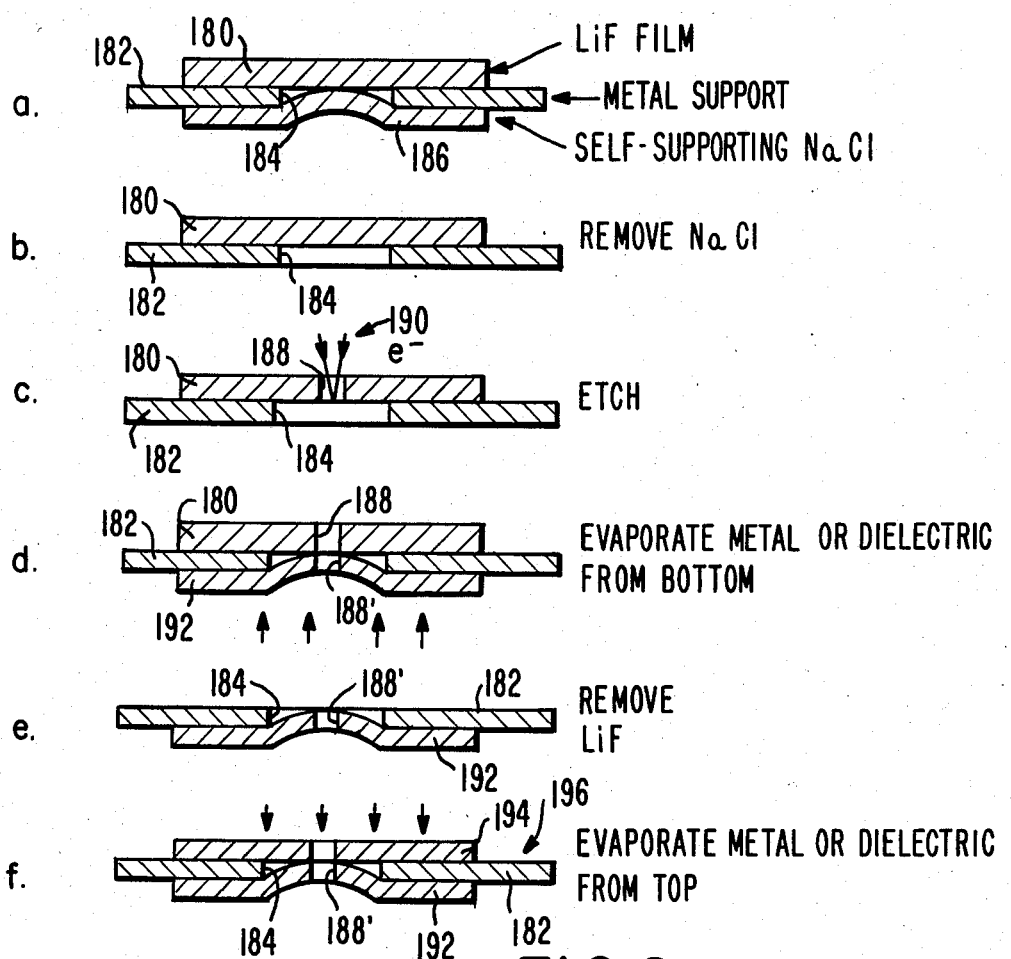
FIGS. 9a through 9f are diagrammatic illustrations of the steps in a first process for making an aperture mask for use in the devices of the present invention.

In the method illustrated in FIG. 9, a thin film 180 of a resist material such as an alkali halide (for example LiF) is vapor deposited to a thickness of about 1000 Å onto a thin metal support 182 having a central opening 184 approximately 50 microns in diameter. The film 180 is supported during formation by a self-supporting film 186 of NaCl previously formed, for example by vapor deposition, on the bottom of the metal support 182, as illustrated in FIG. 9a. The NaCl layer 186 is removed after formation of layer 180 (see FIG. 9b), leaving the layer 180 spanning the opening 184 and being self-supporting.

As illustrated in FIG. 9c, an aperture 188 is etched completely through the resist resist film layer 180 by means of direct electron beam vaporization utilizing an intense beam 190 of a diameter smaller than the hole size to be produced; for example a beam of ½nm is suitable. A beam of 100 keV electrons may be produced, for example, by a scanning transmission electron microscope. Thereafter, a metal or dielectric film 192 is evaporated onto the bottom surface of the metal support 187, and, in the area of opening 184, to the exposed bottom surface of the layer 180 (see FIG. 9d). This evaporated metal or dielectric layer 192 is formed to a thickness of less than or about 500 Å, and thereafter, as illustrated in FIG. 9e, the alkali halide film 180 is removed to leave a free standing optically opaque metal or dielectric film 192 having an aperture 188', corresponding to the aperture 188 in the film 180 and having a diameter of less than or about 500 Å.

An optional step in the formation of the mask is shown in FIG. 9f where, after removal of the resist layer, a top layer of metal or dielectric 194 may be evaporated onto the top surface of the metal support 182 and onto the portion of the upper surface of layer 192 exposed through opening 184. This deposition step leaves the central aperture 188' open to the desired diameter, and completes the formation of an aperture mask 196 which is similar to the mask 78 illustrated in FIG. 3.

Although the method of FIG. 9 illustrates the formation of a single aperture 188' in mask 196, it will be apparent that a plurality of such apertures may be simultaneously formed within the confines of the opening 184 by etching a plurality of apertures in the step of FIG. 9c.

The method of FIG. 10 is similar to that of FIG. 9 for steps, a, b, and c, and thus these figures are similarly numbered. The method of FIG. 10 differs, however, in that a metal or dielectric layer 198 is, in step d, deposited on the top of layer 180 instead of on the bottom of layer 182, the deposited layer 198 having an aperture 188' corresponding to aperture 188 formed in layer 180. This film is deposited to a thickness of about 500 Å.

The final step in the method illustrated in FIG. 10 is shown in FIG. 10e, wherein the resist layer 180 is etched from beneath the support layer 182 in the area of the opening 184, thereby forming a corresponding opening 184'0 in the resist layer 180 and leaving the desired small-diameter aperture 188'. Again, a plurality of apertures may be formed within the confines of opening 184, if desired A third method for fabricating the aperture mask of the present invention is illustrated in FIGS. 11a through 11e. In this method, a metal film or dielectric layer 200 is deposited (FIG. 11a) over a large opening 202 formed in a metal support 204 (for example, in the manner shown in FIGS. 9a and 9b, through the use of an NaCl support beneath the opening). An alkali halide resist film 206 such as LiF is then evaporated (FIG. 11b) onto the top surface of layer 200 and a hole 208, or array of holes, of less than or about 500 Å in diameter are electron beam etched (FIG. 11c) into the layer 206, in the manner previously described.

Ion milling or reactive ion etching is then used (FIG. 11d) to remove that portion of the metal or dielectric layer 200 which is exposed through hole 208 by a known electron beam etching process to thereby produce a corresponding hole 208' in layer 200.

As illustrated in FIG. 11e, the alkali halide film 206 may be removed, leaving behind the free standing opaque film 200 having one or more holes of less than or about 500 Å in diameter.

Suitable metal layers for the methods illustrated in FIGS. 9, 10 and 11 are, for example, AuPd, PtPd alloys, Cr, Ir, Rh, or WRe alloys, while a suitable dielectric layer may be formed from a material such as carbon. The main requirements are that the material used in these layers have a small grain size (for example, less than about 100 Å) to allow precise shaping of apertures, and that the material be optically opaque to the incident radiation at a thickness of about 500 Å.

In conducting experiments utilizing apertures of less than 500 Å, it has been found that such apertures will in fact pass light having a wavelength greater than the diameter of the aperture, and as long as the surface of the aperture mask furthest away from the surface of the emitting sample is within the near field of the emitted light, the emitted light will be collimated to permit detection and resolution of sample entities 80 Å to 2500 Å apart. It has further been found that the measurement of the light passing through the aperture or apertures can be accomplished by photosensitive diode arrays located in the far field. Such arrays can be rapidly activated and have high spectral measurements for every picture element (pixel) of the image produced through the mask. The discrete spectral measurements so obtained permit deconvolution of the distribution of various chemical components in the sample.

Although the present invention has been described in terms of preferred embodiments, it will be apparent that numerous variations and modifications may be made without departing from the true spirit and scope thereof, as set forth in the accompanying claims.

We claim:

1. A method for optically measuring with high resolution the spatial relationship of entities within a sample material, comprising:
   mounting a sample to be viewed on a sample table;
   aligning detecting means with said sample;
   directing a beam of high intensity light onto said sample to produce evanescence in said sample and to cause said sample to emit spectral phenomena characteristic of the sample;
   interposing between said sample and said detecting means an aperture mask incorporating at least one aperture having a diameter of about 500 Å, said mask being within the near field of said emitted phenomena; and detecting said emitted phenomena in the far field.

2. The method of claim 1, wherein said emitted phenomena is light.

3. The method of claim 1, wherein said beam of light is directed at a grazing incidence to the surface of said sample to pass between said sample and said aperture mask, whereby only the emitted phenomena passes through the aperture in said mask.

4. The method of claim 3, wherein said aperture has a diameter less than the wavelength of said beam of light and of said emitted phenomena.

5. The method of claim 3, wherein said beam of light alternates between a first frequency and a second frequency, each frequency producing emitted phenomena corresponding to distinct entities within said sample.

6. The method of claim 5 wherein the step of detecting said emitted phenomena includes spectral analysis thereof.

7. The method of claim 3, further including the step of incrementally scanning said sample to determine the distance between entities within said sample.

8. The method of claim 7, wherein the step of incrementally scanning includes moving said sample in incremental steps of about 100 Å length with respect to said aperture mask.

9. The method of claim 7, wherein the step of incrementally scanning includes moving said aperture mask in incremental steps across the surface of said sample.

10. The method of claim 1 wherein said beam of light is directed substantially perpendicularly onto said sample through said aperture plate.

11. The method of claim 10, further including the step of incrementally scanning said sample to determine the distance between entities within said sample.

12. The method of claim 11, wherein said aperture plate incorporates a plurality of apertures in a coded array, each aperture having a diameter of about 500 Å, and wherein the step of incrementally scanning of said sample encodes the emitted phenomena.

13. The method of claim 12, wherein the step of incrementally scanning includes changing the path of said beam in incremental steps to move said beam across said aperture plate and across the surface of said sample.

14. The method of claim 1, further including directing a second beam of high intensity light onto said sample to produce evanescence in said sample, said first and second beams being directed at different angles of incidence onto the surface of said sample, each beam of light producing spectral phenomena corresponding to distinct entities within said sample.

15. A high resolution light microscope for viewing a sample, comprising:
a support table;
sample means on said support table;
detector means aligned with said sample for receiving radiation emitted therefrom;
an aperture mask positioned between said sample and said detector means, said aperture mask including at least one aperture, each said aperture having a diameter of approximately 500 Å;
a source of high intensity light;
means directing a beam of said high intensity light onto said sample means, said beam producing evanescence in said sample means whereby spectral phenomena characteristic of said sample is produced;

means for locating said aperture mask within the near field of said emitted phenomena whereby phenomena having a wavelength greater than the diameter of said aperture will pass therethrough; and means for locating said detector means in the far field of said emitted phenomena.

16. The high resolution microscope of claim 15, wherein said emitted phenomena is light.

17. The high resolution microscope of claim 15, wherein said beam of light is directed at a grazing incidence to the surface of said sample to pass reflectively between said sample and said aperture mask without passing through any aperture in said aperture mask.

18. The high resolution microscope of claim 17, wherein said aperture mask includes a plurality of apertures.

19. The high resolution microscope of claim 17, further including switching means for shifting said beam of light alternately between two frequencies, each light frequency producing emitted spectral phenomena corresponding to distinct entities within said sample.

20. The high resolution microscope of claim 15, wherein said detector means includes means for analyzing the spectrum of said spectral phenomena.

21. The high resolution microscope of claim 20, further including means for incrementally scanning said sample to determine the distance between entities within said sample.

22. The high resolution microscope of claim 21, wherein said scanning means includes means for moving said sample in incremental steps of about 100 Å in length with respect to said aperture mask.

23. The high resolution microscope of claim 21, wherein said scanning means includes means for moving said sample in incremental steps of about 100 Å past any apertures in said aperture mask.

24. The high resolution microscope of claim 21, wherein said scanning means includes means for moving said aperture mask in incremental steps across the surface of said sample.

25. The high resolution microscope of claim 15, further including means for directing said beam of light substantially perpendicularly onto said sample through said aperture mask.

26. The high resolution microscope of claim 25, further including means for incrementally scanning said sample to determine the distance between entities in said sample.

27. The high resolution microscope of claim 26, wherein said aperture plate incorporates a cyclical plurality of apertures in a coded array, whereby emitted spectral phenomena passing through said aperture plate is encoded.

28. The high resolution microscope of claim 27, wherein said scanning means includes means for scanning said beam of light across said aperture plate and across said sample.

29. The high resolution microscope of claim 15, further including means for directing a second beam of high intensity light onto said sample means to produce evanescence in said sample, said second beam being directed at an angle of incidence different than said first beam, said first and second beams producing emitted spectral phenomena corresponding to distinct entities within said sample.

30. The high resolution microscope of claim 15, wherein said aperture mask comprises a film having a thickness less than the extent of the near field of said emitted radiation.

31. The high resolution microscope of claim 30, wherein said film is a metal.

32. The high resolution microscope of claim 30, wherein said film is a dielectric.

33. The high resolution microscope of claim 30, wherein said aperture mask includes a cyclical plurality of apertures and lines forming a pattern having feature dimensions of less than about 500 Å.

34. The high resolution microscope of claim 30, wherein said detector means includes optical means for receiving light emitted from said sample.

35. The high resolution microscope of claim 15, wherein said source of light is a source of visible light.

36. A high resolution optical microscope having a resolution on the order of less than one tenth the wavelength of light emitted from a sample to be viewed, comprising:
  support means for receiving a sample to be viewed;
  a source of light;
  means directing light from said source to illuminate a sample on said support means and to cause light radiation to be emitted from the sample;
  detector means positioned to receive light radiation emitted from a sample on said support means, said detector means being in the far field region of the emitted light radiation; and
  a thin aperture mask positioned between said support means and said detector means, and movable to a position within the near field region of light radiation emitted from a sample on said support means, said aperture mask including at least one aperture having a diameter on the order of one-tenth the wavelength of said emitted light radiation, said aperture mask being sufficiently thin that said aperture is fully transparent to light radiation emitted by a sample, but thick enough to be opaque where there is no aperture.

37. The high resolution optical microscope of claim 36, wherein said aperture has a diameter on the order of 300A.

38. The high resolution optical microscope of claim 36, wherein said aperture mask includes a multiplicity of spaced apertures, each aperture having a diameter of less than one-tenth the wavelength of said emitted light radiation.

39. The high resolution optical microscope of claim 38, wherein each said aperture has a diameter on the order of one-sixteenth the wavelength of said emitted light radiation.

40. The high resolution optical microscope of claim 39, wherein each said aperture has a diameter on the order of 300A.

41. The high resolution optical microscope of claim 36, wherein said aperture mask has a thickness on the order of 500A, whereby emitted light radiation from a sample which passes through said aperture remains in the near field condition to maintain spatial information obtained from light radiation emitted by a sample.

42. The high resolution optical microscope of claim 36, wherein the light radiation emitted from a sample is an evanescent field produced by spectroscopic phenomena within a sample excited by said source of light.

43. The high resolution optical microscope of claim 42, further including means for incrementally moving said mask with respect to said support means to detect the intensity pattern of the light radiation emitted from a sample to produce an image of the sample.

44. The high resolution optical microscope of claim 42, further including means for incrementally moving said sample with respect to said aperture to detect the intensity pattern of the light radiation emitted from a sample to produce an image of the sample.

* * * * *

UNITED STATES PATENT OFFICE
CERTIFICATE OF CORRECTION

PATENT NO. : 4,662,747
DATED : May 5, 1987
INVENTOR(S) : Isaacson et al.

It is certified that error appears in the above-identified patent and that said Letters Patent are hereby corrected as shown below:

Claim 37, column 18, line 5, "300A" should be --300Å--.

Claim 40, column 18, line 17, "300A" should be --300Å--.

Claim 41, column 18, line 20, "500A" should be --500Å--.

Signed and Sealed this

Twenty-fifth Day of August, 1987

*Attest:*

DONALD J. QUIGG

*Attesting Officer*     *Commissioner of Patents and Trademarks*

UNITED STATES PATENT AND TRADEMARK OFFICE
CERTIFICATE OF CORRECTION

PATENT NO. : 4,662,747
DATED : May 5, 1987
INVENTOR(S) : Isaacson et al

It is certified that error appears in the above-identified patent and that said Letters Patent is hereby corrected as shown below:

In Column 1, line 16, after "invention." insert --This invention was made with Government support under Grant No. 84-0314 and supplemental 84-0314C, awarded by United States Air Force. The Government has certain rights in the invention.--

Signed and Sealed this

Seventh Day of March, 1989

Attest:

DONALD J. QUIGG

Attesting Officer

Commissioner of Patents and Trademarks